(12) United States Patent
Lam

(10) Patent No.: US 8,924,832 B1
(45) Date of Patent: Dec. 30, 2014

(54) EFFICIENT ERROR HANDLING MECHANISMS IN DATA STORAGE SYSTEMS

(75) Inventor: Johnny A. Lam, Firestone, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 228 days.

(21) Appl. No.: 13/533,152

(22) Filed: Jun. 26, 2012

(51) Int. Cl.
| | | |
|---|---|---|
| G06F 11/00 | (2006.01) | |
| G11C 29/00 | (2006.01) | |
| G06F 12/02 | (2006.01) | |
| G06F 12/08 | (2006.01) | |
| G06F 12/06 | (2006.01) | |
| G06F 12/10 | (2006.01) | |
| G11C 29/52 | (2006.01) | |
| G06F 13/40 | (2006.01) | |
| G11C 11/56 | (2006.01) | |
| G06F 9/45 | (2006.01) | |

(52) U.S. Cl.
CPC ........ *G06F 12/0292* (2013.01); *G06F 12/0802* (2013.01); *G06F 12/06* (2013.01); *G06F 12/1054* (2013.01); *G06F 12/1027* (2013.01); *G06F 12/10* (2013.01); *G06F 12/0246* (2013.01); *G11C 29/00* (2013.01); *G11C 29/52* (2013.01); *G11C 29/76* (2013.01); *G06F 13/404* (2013.01); *G11C 11/5628* (2013.01); *G06F 12/0873* (2013.01); *G06F 8/441* (2013.01)
USPC ........... 714/799; 714/773; 714/763; 714/768; 714/702; 714/718; 714/723; 714/742; 714/6.24; 714/48; 711/202; 711/206; 711/103; 707/813; 707/824; 702/59; 702/117; 702/118

(58) Field of Classification Search
CPC . G06F 12/0292; G06F 12/06; G06F 12/0802; G06F 12/10; G06F 12/1027; G06F 12/1054; G06F 12/0246; G06F 2212/608; G06F 2212/7201; G06F 12/0873; G06F 13/404; G06F 8/441; G11C 29/52; G11C 29/00; G11C 29/76; G11C 11/5628; G11C 2029/1806
USPC ......... 714/799, 773, 763, 768, 702, 718, 723, 714/742, 6.24, 48; 711/202, 206, 103; 707/813, 824; 702/59, 117, 118
See application file for complete search history.

(56) References Cited

U.S. PATENT DOCUMENTS

| | | | | |
|---|---|---|---|---|
| 4,959,770 | A | * | 9/1990 | Kondo et al. .................. 711/203 |
| 5,890,189 | A | * | 3/1999 | Nozue et al. .................. 711/100 |
| 6,591,340 | B2 | * | 7/2003 | Chopra et al. ................ 711/118 |
| 6,813,522 | B1 | * | 11/2004 | Schwarm et al. ................. 700/5 |

(Continued)

OTHER PUBLICATIONS

Kumar et al., Solid State Drive (SSD) FAQ, Oct. 2011, Dell, pp. 1-12.*

*Primary Examiner* — John J Tabone, Jr.

(57) ABSTRACT

A data storage system configured to efficiently search and update system data is disclosed. In one embodiment, the data storage system can attempt to correct errors in retrieved data configured to index system data. Metadata stored along with user data in a memory location can be configured to indicate a logical address associated in a logical-to-physical location mapping with a physical address at which user data and metadata are stored. The data storage system can generate modified versions of logical address indicated by the metadata and determine whether such modified versions match the physical address in the logical-to-physical mapping. Modified versions of the logical address can be generated by flipping one or more bits in the logical address indicated by the metadata. Efficiency can be increased and improved performance can be attained.

20 Claims, 6 Drawing Sheets

(56) References Cited

U.S. PATENT DOCUMENTS

| | | | |
|---|---|---|---|
| 7,242,632 B2 * | 7/2007 | Hiraka | 365/230.03 |
| 7,412,585 B2 * | 8/2008 | Uemura | 711/207 |
| 7,418,553 B2 * | 8/2008 | Yoshimi | 711/133 |
| 7,689,604 B2 * | 3/2010 | Sambotin | 707/690 |
| 7,916,421 B1 * | 3/2011 | Liikanen et al. | 360/77.01 |
| 8,135,935 B2 * | 3/2012 | Haertel et al. | 711/202 |
| 8,275,933 B2 * | 9/2012 | Flynn et al. | 711/103 |
| 8,296,337 B2 * | 10/2012 | Flynn et al. | 707/813 |
| 8,341,340 B2 * | 12/2012 | Rub | 711/103 |
| 8,341,500 B2 * | 12/2012 | Byom et al. | 714/773 |
| 8,380,915 B2 * | 2/2013 | Wood et al. | 711/100 |
| 8,412,978 B2 * | 4/2013 | Flynn et al. | 714/6.1 |
| 8,458,133 B2 * | 6/2013 | Wakrat et al. | 707/648 |
| 8,589,766 B2 * | 11/2013 | Post et al. | 714/766 |
| 8,683,456 B2 * | 3/2014 | Byom et al. | 717/168 |
| 8,782,344 B2 * | 7/2014 | Talagala et al. | 711/118 |
| 2003/0182491 A1 * | 9/2003 | Chudnovsky et al. | 711/5 |
| 2008/0010395 A1 * | 1/2008 | Mylly et al. | 711/100 |
| 2009/0204872 A1 * | 8/2009 | Yu et al. | 714/773 |
| 2011/0238886 A1 * | 9/2011 | Post et al. | 711/103 |
| 2012/0166713 A1 * | 6/2012 | Saeki et al. | 711/103 |
| 2012/0324148 A1 * | 12/2012 | Stonelake et al. | 711/103 |
| 2013/0036262 A1 * | 2/2013 | Flynn et al. | 711/103 |
| 2013/0124931 A1 * | 5/2013 | Chen | 714/718 |
| 2013/0159603 A1 * | 6/2013 | Whitney | 711/103 |
| 2013/0166820 A1 * | 6/2013 | Batwara et al. | 711/103 |
| 2013/0191601 A1 * | 7/2013 | Peterson et al. | 711/137 |
| 2013/0275656 A1 * | 10/2013 | Talagala et al. | 711/103 |
| 2014/0059406 A1 * | 2/2014 | Hyun et al. | 714/773 |
| 2014/0075208 A1 * | 3/2014 | Herman et al. | 713/193 |

* cited by examiner

EFFICIENT ERROR HANDLING MECHANISMS IN DATA STORAGE SYSTEMS

BACKGROUND

1. Technical Field

This disclosure relates to data storage systems for computer systems. More particularly, the disclosure relates to mechanisms for efficient searching and updating of system data.

2. Description of the Related Art

Data storage systems maintain various types of system data in the course of their normal operation. System data can include, for example, logical to physical mapping information, listing of defective physical locations, allocation information, and so on. However, managing and searching system data involves substantial overhead, for example, when searching is performed during execution of data storage operations and housekeeping tasks. This may in turn cause the performance of data storage systems to regress. Accordingly, it is desirable to provide more efficient mechanisms for searching and updating system data.

BRIEF DESCRIPTION OF THE DRAWINGS

Systems and methods that embody the various features of the invention will now be described with reference to the following drawings, in which.

DETAILED DESCRIPTION

Figure 1A:
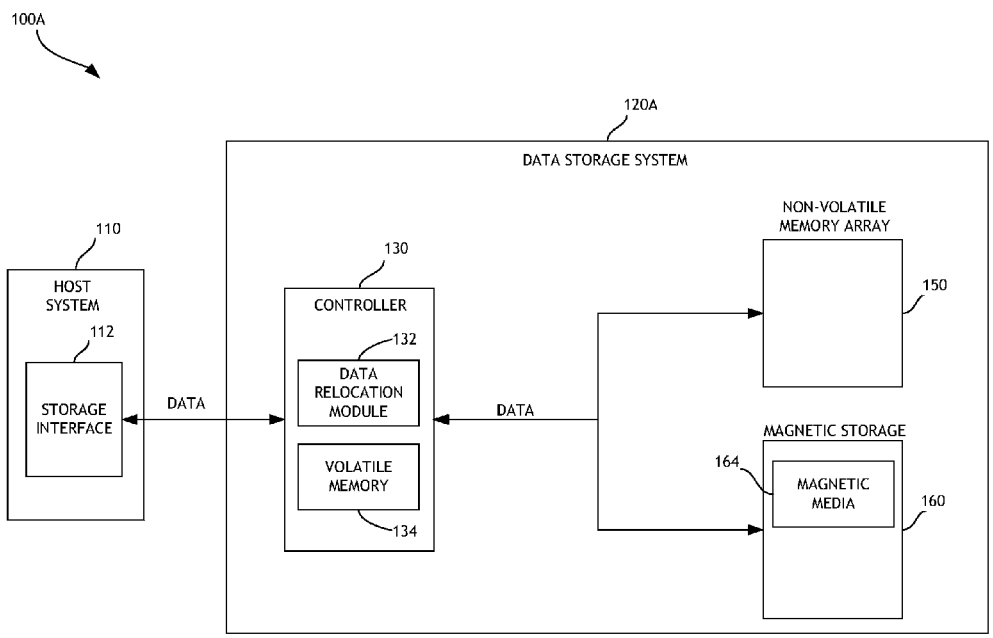
FIG. 1A illustrates a combination of a host system and a data storage system that implements mechanisms for efficient searching and updating of system data according to one embodiment of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems generate and maintain various types of system data for performing data storage operations and housekeeping tasks. For example, system data can include a mapping that associates physical memory locations with logical memory locations. As another example, system data can include wear leveling information used for uniformly or substantially uniformly spreading out program or write operations across memory locations or data allocations units in order to prolong the operational life of the memory (e.g., solid state memory). As yet another example, system data can include allocation information that records associations between memory locations or data allocation units with groups of sets of memory locations or data allocation units. Such groupings can be utilized in order to achieve concurrency of performing at least some data access operations. Because system data can be voluminous, efficient system data search and update mechanisms can improve performance of data storage systems.

Embodiments of the present invention are directed to mechanisms for searching and updating system data efficiently. In some embodiments, disclosed mechanisms are particularly applicable during execution of operations that relocate or move data, such as garbage collection, wear leveling error handling (e.g., via solid-state memory block reallocation), protection and/or recovery from read disturb, and so on. For example, system data can comprise a mapping between logical and physical locations or addresses, and the mapping can be efficiently searched for a logical address corresponding to a particular physical address determined to be defective during garbage collection. This search can be performed directly and completed in constant or substantially constant time (e.g., O(1) using big O notation). In some embodiments, this results in an improvement over indirect searching mechanisms, which may be completed in linear or substantially linear time (e.g., O(n) using big O notation). In other embodiments, disclosed mechanisms can be used during execution of data storage and/or housekeeping operations other than data relocation or move.

In some embodiments of the present invention, a data storage system comprising a non-volatile memory array can be configured to maintain a mapping associating physical addresses with logical addresses. The mapping can be indexed by the logical addresses. The data storage system can be configured to attempt to move user data stored at a particular physical address to another physical address, and to associate in the mapping a logical address corresponding to the particular physical address with the physical address where data is being moved. In response to determining that the user data stored at the particular physical address is unrecoverable, the data storage system can be configured to determine in the mapping the logical address associated with the particular physical address. This determination can be made based at least in part on metadata stored at the particular physical address. The data storage system can further be configured to dissociate in the mapping the logical address from the particular physical address. In addition, the data storage system can indicate that user data is unrecoverable.

In some embodiments, metadata can be configured to indicate a logical address associated in the mapping with a physical address at which user data and metadata are stored. The data storage system can be configured to determine whether the logical address indicated in the metadata is associated with the particular physical address in the mapping. If not, the data storage system can be configured to attempt to locate a logical address corresponding to the particular physical address in the mapping using one or more modified versions of data read from the metadata. The modified versions can be generated according to a mechanism that attempts to first correct errors in the metadata that are more likely to have occurred before correcting errors that are less likely. For example, modified versions of data read from the metadata can be generated by flipping one bit at a time, two bits at a time, three bits at a time, etc.

System Overview

FIG. 1A illustrates a combination 100A of a host system and a data storage system that implements mechanisms for efficient searching and updating of system data according to one embodiment of the invention. As is shown, the data storage system 120A (e.g., a hybrid disk drive) includes a controller 130, a non-volatile memory array 150, and magnetic storage 160, which comprises magnetic media 164. The non-volatile memory array 150 comprises non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. Non-volatile memory can be partitioned into blocks that can comprise one or more pages, which can comprise one or memory locations configured to store data. The data storage system 120A can further comprise other types of storage.

The controller 130 can be configured to receive data and/or storage access commands from a storage interface module 112 (e.g., a device driver) of a host system 110. Storage access commands communicated by the storage interface 112 can include write data (or program data) and read data commands issued by the host system 110. Read and write commands can specify a logical address (e.g., LBA) used to access the data storage system 120A. The controller 130 can execute the received commands in the non-volatile memory array 150, magnetic storage 160, etc.

Data storage system 120A can store data communicated by the host system 110. In other words, the data storage system 120A can act as memory storage for the host system 110. To facilitate this function, the controller 130 can implement a logical interface. The logical interface can present to the host system 110 data storage system's memory as a set of logical addresses (e.g., contiguous address) where host data can be stored. Internally, the controller 130 can map logical addresses to various physical memory locations (referenced by addresses) in the non-volatile memory array 150 and/or other storage modules. The controller 130 includes a data relocation module 132 configured to move or relocate user data, and perform searching and updating of system data associated with data relocation. The controller 130 can include volatile memory 134 for efficiently storing and accessing data, such as frequently used system data. In other embodiments, volatile memory 134 can be located outside the controller 130.

Figure 1B:
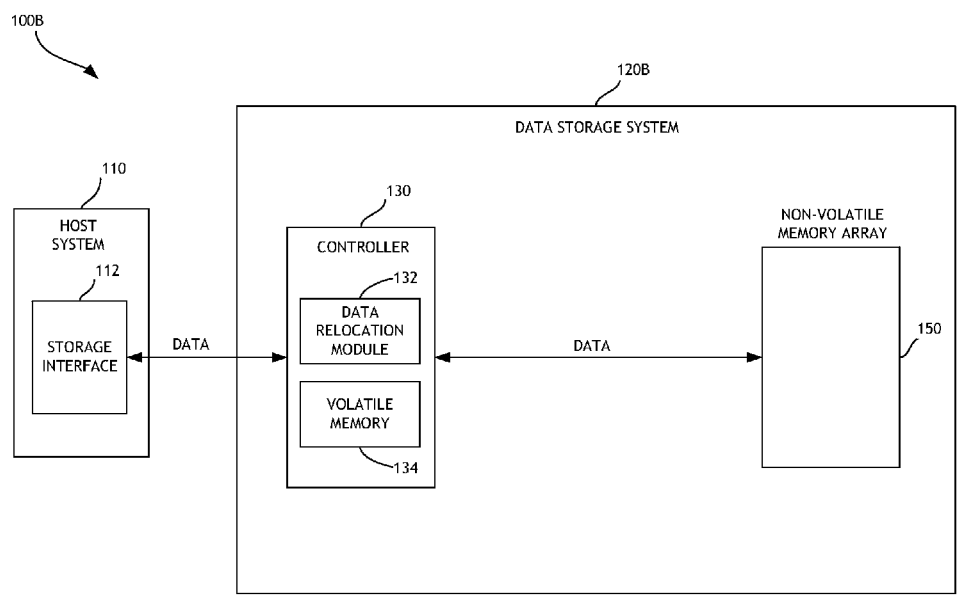
FIG. 1B illustrates a combination of a host system and a data storage system that implements mechanisms for efficient searching and updating of system data according to another embodiment of the invention.

FIG. 1B illustrates a combination 100B of a host system and a data storage system that implements mechanisms for efficient searching and updating of system data according to another embodiment of the invention. As is illustrated, data storage system 120B (e.g., solid-state drive) includes a controller 130 and non-volatile memory array 150. These and other components of the combination 100B are described above.

Efficient Searching and Updating of System Data

Figure 2:
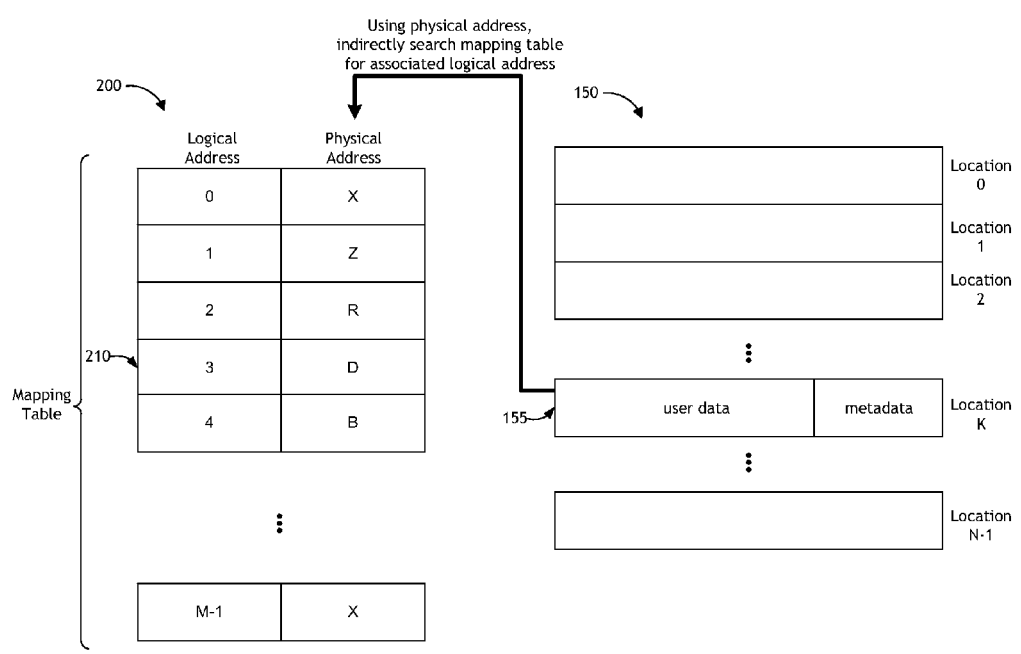
FIG. 2 illustrates a mechanism of indirectly searching and updating system data according to one embodiment of the invention.

FIG. 2 illustrates a mechanism of indirectly searching and updating system data according to one embodiment of the invention. The illustrated mechanism can be executed by the controller 130 and/or data relocation module 132. The non-volatile memory array 150 is partitioned into physical locations 0, 1, 2, . . . , K, . . . , N−1 configured to store user data and metadata. This is illustrated by location K 155. Physical locations can correspond to individual memory locations or sets of memory locations, such as pages, blocks, data allocation units, zones, etc. System data can comprise a mapping 200 configured to record or indicate associations between logical and physical addresses. The mapping can be represented as a table or any other suitable data structure, such as array, graph, etc. As is illustrated, entry or row 210 associates logical address 3 with physical address D. For example, physical address D can store user data corresponding to logical address 3.

In one embodiment, the data storage system 120A and/or 120B (via, for example, the controller 130) may perform an operation which can involve determining a logical address corresponding to a particular physical address. For example, the data storage system can perform garbage collection operation during which it is determined that user data stored in a particular physical location is unrecoverable (e.g., read data operation has encountered an uncorrectable error that cannot be fixed or corrected by the error correction code (ECC) mechanism). This may be caused by the physical location being defective. To indicate that user data stored in the defective physical location has been lost, data storage system can attempt to determine the logical address associated with the defective physical location (e.g., location K 155). This may be accomplished by searching the mapping table 200 using the physical address corresponding to the defective physical location. However, the mapping table 200 may be indexed or organized according to the logical address, and such indirect search based on the physical address may take linear or substantially linear (or O(n)) time. In other words, the physical address can be used to sequentially check entries of the mapping table 200 (e.g., starting at the first entry corresponding to logical address 0) until a match is found.

Figure 3:
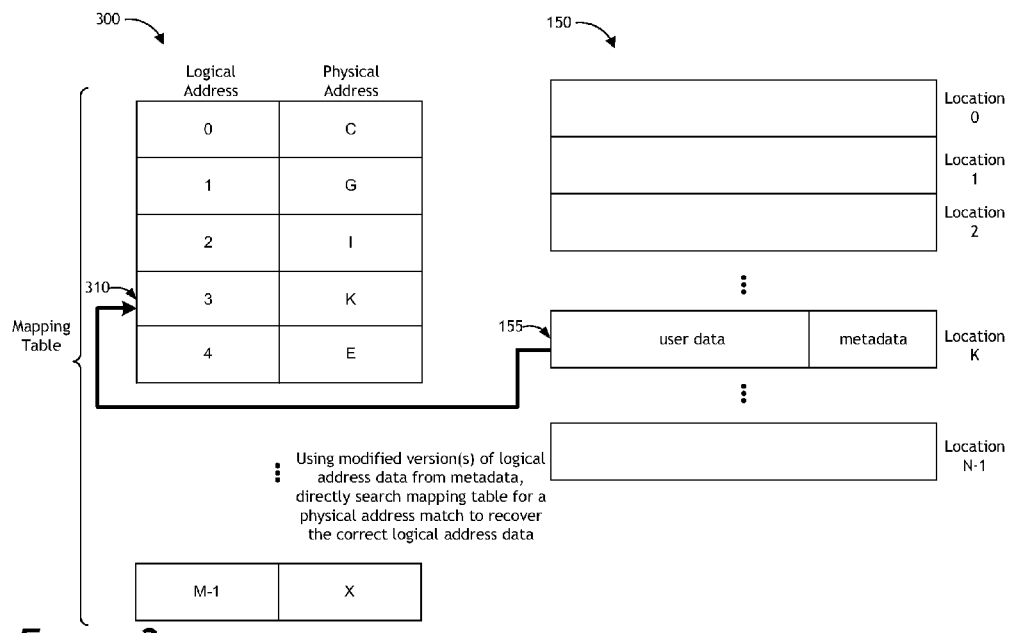
FIG. 3 illustrates a mechanism for directly searching and updating system data according to one embodiment of the invention.

FIG. 3 illustrates a mechanism for directly searching and updating system data according to one embodiment of the invention. The illustrated mechanism can be executed by the controller 130 and/or data relocation module 132. As is illustrated in FIG. 3, the non-volatile memory array 150 is partitioned into physical locations 0, 1, 2, . . . , K, . . . , N−1 configured to store user data and metadata. Physical locations can correspond to individual memory locations or sets of memory locations, such as pages, blocks, data allocation units, zones, etc. This is illustrated by location K 155. System data can comprise a mapping 300 configured to record or indicate associations between logical and physical addresses. The mapping can be represented as a table or any other suitable data structure, such as array, graph, etc. As is illustrated, entry or row 310 associates logical address 3 with physical address K. For example, physical address D can store user data corresponding to logical address 3.

In one embodiment, the data storage system 120A and/or 120B (via, for example, the controller 130) may perform an operation which can involve determining a logical address corresponding to a particular physical address. For example, the data storage system can perform garbage collection operation during which it is determined that user data stored in a particular physical location is unrecoverable (e.g., read data operation has encountered an uncorrectable error that cannot be fixed or corrected by the error correction code (ECC) mechanism). This may be caused by the physical location being defective. To indicate that user data stored in the defective physical location has been lost, the data storage system can attempt to determine the logical address associated with the defective physical location. This may be accomplished by directly searching the mapping table 300 using the logical address associated with the defective physical location (e.g., location K 155).

In one embodiment, metadata can be configured to indicate a logical address associated in the mapping table 300 with a physical address at which user data and metadata are stored. The data storage system (via, for example, the controller 130 and/or the data relocation module 132) can use the logical address indicated in the metadata to determine whether that logical address is associated in the mapping table 300 with the physical address corresponding to the defective physical location (e.g., location K 155). For example, if the logical address indicated by the metadata at location "K" is "3," then a lookup of the mapping table at the entry for logical address "3" would confirm that it is indeed associated with physical address "K." This matching case means that the logical address as read from the metadata is correct. However, if the logical address indicated by the metadata at location "K" is another value, for example "4," then the lookup would return a mismatch in physical address ("E" rather than "K"), indicating that the logical address data ("4") in the metadata is incorrect. In such a case where there is no match (due match (due to, for example, metadata being corrupted), the data storage system can attempt to locate, in the mapping table 300, the right logical address corresponding to the physical location in question using one or more modified versions of data read from the metadata. In one embodiment, modified versions of the logical address can be generated according to the likelihood of correcting the error(s) in the logical address indicated by the metadata. For example, the data storage system (via, for example, the controller 130 and/or the data relocation module 132) can generate a first modified version of the data read from the metadata by flipping a single bit in the data read from the metadata. These modified versions of metadata can then be used to directly search (lookup) the mapping table 300 for a physical address that matches the physical address of the user data/metadata in order to recover the correct logical address (e.g., one that was originally written into the metadata).

In one embodiment, modified versions of metadata can be created according to a mechanism that takes into account and attempts to correct errors in data read from the metadata according to the relative probabilities of errors. For example, errors that are more likely can be attempted to be corrected before less likely errors. In one embodiment, a single bit is flipped in the data read from the metadata, and these modified versions of metadata are used to directly search the mapping table 300. If single-bit flipped versions of metadata do not result in locating the correct logical-physical address mapping (e.g., K to 3 as is indicated by row 310), two bits can be flipped in the data read from the metadata. These modified versions of metadata are used to directly search the mapping table 300. If two-bit flipped versions of metadata do not result in locating the correct logical to physical address mapping (e.g., K to 3 as is indicated by row 310), three bits can be flipped in the data read from the metadata. These modified versions of metadata are used to directly search the mapping table 300. If three-bit flipped versions of metadata do not result in locating the correct logical to physical address mapping (e.g., K to 3 as is indicated by row 310), four, five, and so on bits can be flipped. In alternative embodiments, any number of bits can be flipped in any order, such as one bit, 5 bits, 3 bits, etc. Further, not all bit-flipped modified version (e.g., not all single-bit flipped modified versions) may be used to directly search the mapping table 300.

Figure 4:
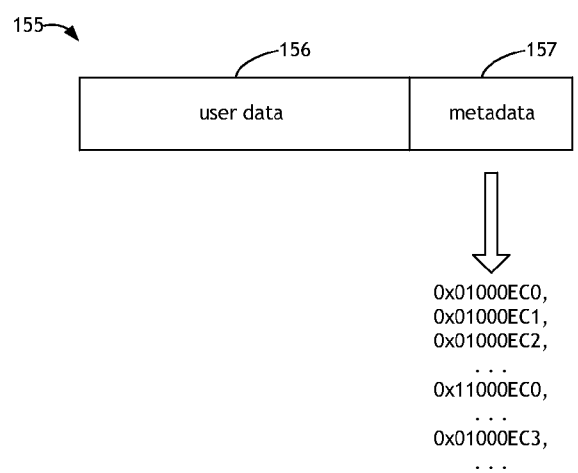
FIG. 4 illustrates the direct searching and updating mechanism of FIG. 3 according to one embodiment of the invention.

This mechanism is shown in FIG. 4, which illustrates the direct searching and updating mechanism of FIG. 3 according to one embodiment of the invention. As is illustrated, location K 155 (e.g., which is defective) stores user data 156 and metadata 157 (e.g., which are corrupted). For example, the logical address indicated in the recovered or read (but potentially corrupted) metadata is 0x01000EC0 (in hexadecimal notation). If this logical address is not associated with the physical address K in the mapping table 300, modified versions of metadata can be generated by flipping one bit at a time. This is illustrated by the following values: 0x01000EC1, 0x01000EC2, . . . , 0x11000EC0, etc. Next, two bits at a time can be flipped, as is illustrated by 0x01000ED1, and so on.

In one embodiment, direct search and updating of based on the logical address, as is illustrated in FIGS. 3 and 4, may take constant or substantially constant (or O(1)) time. This can provide more efficient operation especially in cases when system data that is searched in voluminous. For example, a data storage system can utilize 32-bit physical addresses (e.g., represented by physical chunk numbers (PCN)) and 32-bit logical addresses (e.g., represented by logical chunk numbers (LCN)). The mapping table 200 and/or 300 can comprise $2^{32}$=4,294,967,296 entries (one entry for unique logical address). As shown by FIG. 2, linear or substantially linear search of the mapping table by indirect use of the physical address would, in the worst case, take 4,294,967,296 operations (e.g., lookup operations). Direct search based on modified (e.g., bit-flipped) versions of data stored in the metadata would also, in worst case, take 4,294,967,296 operations (e.g., lookup operations), as shown in the table below. While the worst case is the same, direct search based on modified versions of logical address data stored in the metadata has a greater chance of locating the matching physical address (e.g., PCN) in the mapping table with substantially fewer lookups. This is because modified versions of metadata can be generated in an order that prioritizes the most likely type of error(s) in the metadata and the search can start with these prioritized lookups first, as indicated in an example outlined in the following table. For example, searching can start with focusing on a common 1-bit error, which may require just 32 lookups, at worst, and if that fails, going on to a 2-bit error may just require at worst 496 lookups. In many situations a match may be found very early since errors in which only a few bits are flipped are common. These numbers are significantly smaller than the worst case of the indirect search based on physical address (4,294,967,296 lookups).

| | |
|---|---:|
| No bit flipped (e.g., logical address indicated by metadata is correct) | 1 lookup |
| 1 bit flipped (all possible combinations) | 32 lookups |
| 2 bit flipped (all possible combinations) | 496 lookups |
| 3 bit flipped (all possible combinations) | 4960 lookups |
| 4 bit flipped (all possible combinations) | 35960 lookups |
| . . . | |
| 32 bits flipped | 1 lookup |
| | Total: 4,294,967,296 lookups |

Figure 5:
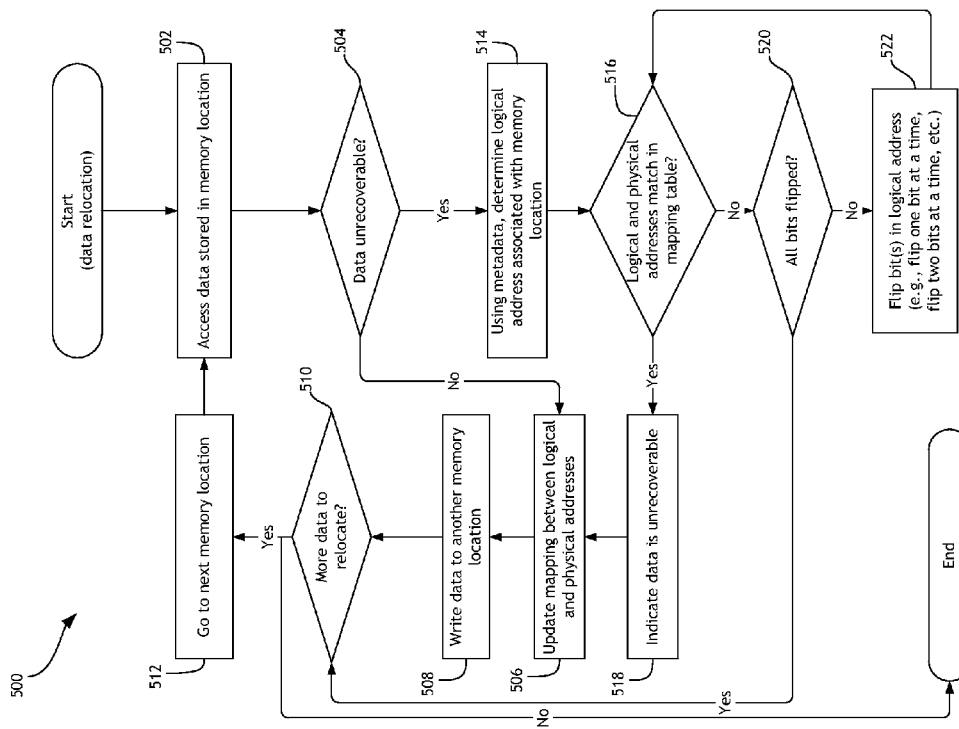
FIG. 5 is a flowchart illustrating a process of performing data relocation according to one embodiment of the invention.

FIG. 5 is a flowchart illustrating a process 500 of performing data relocation according to one embodiment of the invention. The process 500 can be implemented by the controller 130 and/or the data relocation module 132. Data relocation can be performed in connection with garbage collection, wear leveling, error handling, read disturb prevention and correction, and so on. The process 500 can begin in block 502, where the process attempts to access data (e.g., user data) stored in a memory location that is accessed (e.g., in order to move the data to another memory location). In block 504, the process 500 can determine whether the stored data is accessible. For example, the process 500 can determine whether an uncorrectable error (e.g., uncorrectable ECC error) was encountered during the retrieval of stored data.

If the stored data was accessed successfully, the process 500 can transition to block 506 where it can update the mapping (e.g., mapping table 200 and/or 300). In one embodiment, the process 500 can update the mapping by associating a memory location (e.g., identified by a physical address) to which the stored data will be moved with the logical memory location (e.g., identified by a logical address). The logical address can be determined from the metadata. The memory location from which the data is moved can be disassociated with the logical address in the mapping table. The process 500 can transition to block 508 where it can write or move the data to another memory location (e.g., physical address that was associated with the logical address in block 506). In block 510, the process can determine whether there is more data to relocate or move. If there is more data to relocate, the process 500 can transition to block 512 and select next memory location for relocating data, and transition to block 502. If there is no more data to relocate, the process 500 can terminate.

If in block 504, the process 500 determines that stored data is unrecoverable (e.g., an uncorrectable ECC error was encountered while reading the data), the process can transition to block 514. For example, the memory location where data is stored may be defective. In block 514, the process 500 can use metadata retrieved from the defective memory location to determine in the mapping (e.g., mapping table 200 and/or 300) a logical address associated with the physical address corresponding to the defective memory location. As discussed previously, the metadata may include data indicating a logical address. In one embodiment, the process 500 can access the entry (e.g., row) associated with the logical address identified by the metadata. If in block 516 the process 500 determines that in that mapping entry (e.g., row) the logical address matches the physical address corresponding to the defective memory location, the process can transition to block 518 where it can indicate that the data stored in the defective memory location is unrecoverable or invalid. This may be advantageous, for example, if the host system 110 subsequently attempts to retrieve unrecoverable user data (e.g., by accessing the corresponding logical address). In one embodiment, the process 500 can update metadata (e.g., metadata at the memory location where unrecoverable data will be moved in block 508) to indicate that associated user data is unrecoverable. In another embodiment, the process 500 can in addition or instead indicate that user data is unrecoverable in the mapping table or another suitable type of system data. The process 500 can transition to block 506, where is can update the mapping as described above.

If in block 516, the process 500 determines that the logical address (e.g., indicated by the metadata) does not match in the mapping the physical address corresponding to the defective memory location, the process 500 can modify data read from the metadata in order to attempt to correct the errors in the logical address indicated by the metadata. In one embodiment, the process 500 can flip bits in the data read from the metadata. In block 520, the process can determine whether it already attempted to determine the logical address using all suitable modified (e.g., bit-flipped) versions of data read from the metadata. If this is the case, the process 500 can transition to block 510, where it can determine whether there is more data to relocate or move as described above. If the process 500 determines that there are other modified versions of metadata that have not yet been tried, the process can transition to block 522. In block 522, the process 500 can flip bits in data read from the metadata as is described above. Once the process 500 generates a modified version of data read from the metadata, it can transition to block 516 and determine whether the logical address indicated by the modified version of metadata matches the physical address in the mapping. If it does not, the process 500 can transition to block 522 (via block 520), and generate another modified version(s) of logical address indicated by the metadata. This mechanism may continue until the process 500 generates the correct logical address (e.g., logical address which matches the defective physical address in the mapping table) or until the process 500 determines in block 520 that all modified versions of the logical address have been exhausted. In one embodiment, the yes branch of block 520 indicates that if all variations/combinations have been tried and yet no match has been found in the mapping table, this means that the data at the read location is no longer valid so there is no need to indicate the associated data as unrecoverable. Hence, the process moves directly to block 510.

In one embodiment, the process 500 can continue to relocate other data while it determines the logical address associated with the defective physical location. For example, the determination of the logical address can be performed in the background. In another embodiment, the process 500 can stop relocating other data until it determines (or fails to determine) the logical address associated with the defective physical address.

Conclusion

Embodiments of data storage systems disclosed herein are configured to efficiently search and update system data. This can be accomplished by attempting to correct errors in retrieved data configured to index system data. In one embodiment, metadata stored along with user data in a memory location can be configured to indicate a logical address associated in a logical-to-physical location mapping with a physical address at which user data and metadata are stored. The data storage system can be configured to generate modified versions of logical address indicated by the metadata and determine whether such modified versions match the physical address in the logical-to-physical mapping. In one embodiment, modified versions of the logical address can be generated by flipping one or more bits in the logical address indicated by the metadata. Efficiency can be increased and improved performance can be attained.

Other Variations

Those skilled in the art will appreciate that in some embodiments, other types of system data can be searched according to the disclosed mechanisms. Although such mechanisms are described in the context of searching the mapping (e.g., logical to physical mapping table) during performing garbage collection, the disclosed mechanisms can be applied to other types of system data and other types of operations, such as wear leveling, error handling, read disturb prevention and correction, and so on. Further, in some embodiments, modified versions of metadata can be created by mechanisms other than flipping bits, such as bit masking, arithmetic operation(s), and the like. Also, any suitable mechanism for indicating that relocated data is unrecoverable or invalid can be used in addition to or instead of the disclosed mechanisms. Additional system components can be utilized, and disclosed system components can be combined or omitted. The actual steps taken in the disclosed processes, such as the processes illustrated in FIGS. 2-5, may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection.

Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A non-volatile data storage system, comprising:
    a non-volatile memory array comprising a plurality of physical addresses each configured to store user data and metadata; and
    a controller configured to:
        maintain a mapping associating a set of physical addresses of the plurality of physical addresses in the non-volatile memory array with a set of logical addresses,
        the set of physical addresses including at least a first physical address and a second physical address different from each other, the first physical address storing at least a first user data and a first metadata,
        the set of logical addresses including at least a first logical address and a second logical address different from each other, the mapping indexed by the set of logical addresses;
        attempt to move the first user data from the first physical address to the second physical address by associating in the mapping the first logical address with the second physical address;
        determine whether the first user data is unrecoverable; and
        in response to determining that the first user data is unrecoverable:
            determine, in the mapping, based at least in part on the first metadata, whether the first logical address is associated with the first physical address;
            if the first logical address is associated in the mapping with the first physical address, dissociate in the mapping the first logical address from the first physical address; and
            if the logical address indicated in the first metadata is not associated with the first physical address, attempt to locate the second logical address corresponding to the first physical address in the mapping based on flipping one or more bits in data read from the first metadata.

2. The non-volatile data storage system of claim 1, wherein the controller is further configured not to use the first physical address to indirectly search the mapping for the first logical address.

3. The non-volatile data storage system of claim 1, wherein:
    each metadata is configured to indicate that a logical address is associated in the mapping with a physical address at which the corresponding user data and metadata are stored; and
    the controller is further configured to determine whether the logical address indicated in the first metadata is associated in the mapping with the first physical address.

4. The non-volatile data storage system of claim 3, wherein the controller is further configured to determine the first logical address by at least:
    if the logical address indicated in the first metadata is associated with the first physical address, using the indicated logical address in the disassociating; and
    if the logical address indicated in the first metadata is not associated with the first physical address, attempting to locate the second logical address corresponding to the first physical address in the mapping using one or more modified versions of the data read from the first metadata, the one or more modified versions of data generated based on flipping one or more bits in the data read from the first metadata.

5. The non-volatile data storage system of claim 4, wherein the controller is further configured to:
    generate a first modified version of the data by flipping a single bit in the data; and
    first attempt to locate in the mapping the second logical address based on the first modified version of the data.

6. The non-volatile data storage system of claim 5, wherein the controller is further configured to:
    generate a second modified version of the data read from the first metadata by flipping two or more bits in the data, if the second logical address is not located; and
    second attempt to locate in the mapping the second logical address based on the second modified version of the data.

7. The non-volatile data storage system of claim 1, wherein the controller is further configured to determine that the first user data is unrecoverable when an uncorrectable error is generated in response to an access of the first user data.

8. The non-volatile data storage system of claim 7, wherein the uncorrectable error comprises an error that cannot be corrected by an error correction code (ECC).

9. The non-volatile data storage system of claim 1, wherein, if the first user data is unrecoverable, the controller is further configured to indicate that a second data stored at the second physical address is invalid.

10. The non-volatile data storage system of claim 1, wherein the data storage system is a hybrid disk drive.

11. In a non-volatile data storage system comprising a controller and a non-volatile memory array comprising a plurality of physical addresses each configured to store user data and metadata, a method of relocating data, the method comprising:
    maintaining a mapping associating a set of physical addresses of the plurality of physical addresses in the non-volatile memory array with a set of logical addresses,
    the set of physical addresses including at least a first physical address and a second physical address different from each other, the first physical address storing at least a first user data and a first metadata, the set of logical addresses including at least a first logical address and a second logical address different from each other, the mapping indexed by the set of logical addresses;

attempting to move the first user data from the first physical address to the second physical address by associating in the mapping the first logical address with the second physical address;

determining whether the first user data is unrecoverable; and in response to determining that the first user data is unrecoverable:
- determining, in the mapping, based at least in part on the first metadata, whether the first logical address is associated with the first physical address;
- if the first logical address is associated in the mapping with the first physical address, dissociating, in the mapping, the first logical address from the first physical address; and
- if the logical address indicated in the first metadata is not associated with the first physical address, attempting to locate the second logical address corresponding to the first physical address in the mapping based on flipping one or more bits in data read from the first metadata, wherein the method is performed under the control of the controller.

12. The method of claim 11, wherein the first physical address is not used to indirectly search the mapping for the first logical address.

13. The method of claim 11, wherein:
each metadata is configured to indicate a logical address associated in the mapping with a physical address at which the corresponding user data and metadata are stored; and
using the first metadata to determine whether the logical address indicated in the first metadata is associated in the mapping with the first physical address.

14. The method of claim 13, further comprising determining the first logical address by at least:

if the logical address indicated in the first metadata is associated with the first physical address, using the indicated logical address in the disassociating; and if the logical address indicated in the first metadata is not associated with the first physical address, attempting to locate the second logical address corresponding to the first physical address in the mapping using one or more modified versions of the data read from the first metadata, the one or more modified versions of data generated based on flipping one or more bits in the data read from the first metadata.

15. The method of claim 14, further comprising:
generating a first modified version of the data by flipping a single bit in the data; and
first attempting to locate in the mapping the second logical address corresponding to the first physical address based on the first modified version of the data.

16. The method of claim 15, further comprising:
generating a second modified version of the data by flipping two or more bits in the data, if the second logical address is not located; and
second attempting to locate in the mapping the second logical address corresponding to the first physical address based on the second modified version of the data.

17. The method of claim 11, wherein determining that the first user data is unrecoverable comprises determining whether an uncorrectable error is generated in response to accessing the first user data.

18. The method of claim 17, wherein the uncorrectable error comprises an error that cannot be corrected by an error correction code (ECC).

19. The method of claim 11, further comprising indicating that a second data stored at the second physical address is invalid, if the first user data is unrecoverable.

20. The method of claim 11, wherein the data storage system is a hybrid disk drive.

* * * * *